United States Patent
Ahn

(10) Patent No.: US 8,022,782 B2
(45) Date of Patent: Sep. 20, 2011

(54) TWO-POINT PHASE MODULATOR AND METHOD OF CALIBRATING CONVERSION GAIN OF THE SAME

(75) Inventor: Hyung-Ki Ahn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 91 days.

(21) Appl. No.: 12/585,319

(22) Filed: Sep. 11, 2009

(65) Prior Publication Data
US 2010/0066459 A1 Mar. 18, 2010

(30) Foreign Application Priority Data
Sep. 16, 2008 (KR) .................. 10-2008-0090751

(51) Int. Cl.
H03C 3/00 (2006.01)
H03C 3/06 (2006.01)
H03C 3/09 (2006.01)
H03L 7/08 (2006.01)
H03L 7/085 (2006.01)
H03L 7/18 (2006.01)
H04L 27/20 (2006.01)

(52) U.S. Cl. .......... 332/144; 332/103; 332/128; 331/14; 331/16; 331/23; 331/25

(58) Field of Classification Search .......... 332/103–105, 332/127, 128, 144–148; 327/156–159; 331/14, 331/16–18, 23, 25; 375/302, 308, 376; 455/42, 455/102, 110–113, 260
See application file for complete search history.

(56) References Cited

U.S. PATENT DOCUMENTS

| | | | |
|---|---|---|---|
| 6,211,747 B1 | 4/2001 | Trichet et al. | |
| 6,515,553 B1 * | 2/2003 | Filiol et al. | ................ 332/127 |
| 6,670,861 B1 | 12/2003 | Balboni | |
| 6,774,738 B2 | 8/2004 | Hammes et al. | |
| 6,933,798 B2 | 8/2005 | Hammes et al. | |
| 7,015,738 B1 | 3/2006 | Cao | |
| 7,157,985 B2 | 1/2007 | Mitani et al. | |

FOREIGN PATENT DOCUMENTS
JP 2007-221773 8/2007

OTHER PUBLICATIONS

Robert B. Staszewski et al., "Just-In-Time Gain Estimation of an RF Digitally-Controlled Oscillator for Digital Direct Frequency Modulation" IEEE Transactions on Circuits and Systems—II: Analog and Digital Processing, vol. 50, No. 11, Nov. 2003.

* cited by examiner

Primary Examiner — David Mis
(74) Attorney, Agent, or Firm — Harness, Dickey & Pierce, P.L.C.

(57) ABSTRACT

A two-point phase modulator and a method of calibrating conversion gain of the same are provided. The two-point phase modulator locks an output frequency signal by charging and pumping charge in a phase-locked loop (PLL) circuit at the beginning of operation, opens a loop of the PLL circuit for a period of time, and applies a step signal, thus calibrating conversion gain of a modulation signal that controls the output frequency signal. Thus, the conversion gain may be accurately calibrated by the calibration operation at one time.

19 Claims, 3 Drawing Sheets

TWO-POINT PHASE MODULATOR AND METHOD OF CALIBRATING CONVERSION GAIN OF THE SAME

PRIORITY STATEMENT

This application claims the benefit of priority under 35 U.S.C. §119 to Korean Patent Application No. 10-2008-0090751, filed on Sep. 16, 2008, the entire contents of which are herein incorporated by reference.

BACKGROUND

1. Field

Example embodiments relate to a phase modulator, and more particularly, to a two-point phase modulator and method of calibrating conversion gain of the two-point phase modulator.

2. Description of Related Art

A phase modulator using a phase-locked loop (PLL) has been widely used. The phase modulator using the PLL may convert modulation data into a desired frequency signal by adjusting a division ratio of a divider provided in the phase modulator using a sigma-delta modulator. However, when the phase modulator is implemented using the PLL, a data rate may be limited by a bandwidth of the PLL.

In order to overcome the limitations of the phase modulator, a two-point phase modulator is provided to adjust the division ratio of the divider of the PLL by applying a digital modulation signal and to expand the bandwidth of the PLL by additionally applying analog modulation data to an adder of the PLL, thereby increasing the data rate.

SUMMARY

Example embodiments provide a two-point phase modulator which can calibrate conversion gain. Other example embodiments provide a method of calibrating conversion gain of a two-point phase modulator.

Example embodiments are directed to a two-point phase modulator. The two-point phase modulator includes an input unit that outputs a division control signal based on a channel frequency signal and modulation data. A phase-locked loop (PLL) circuit forms a loop during an activation period of a loop control signal at a beginning stage, detects a difference in phase between a reference frequency signal and a divided output frequency signal, stores a voltage corresponding to the difference in phase, outputs an output frequency signal by changing a frequency based on the stored voltage and a modulation signal, and generates the divided output frequency signal by dividing the output frequency signal based on the division control signal. A modulation signal generator converts the modulation data from digital to analog based on a conversion gain value and outputs the modulation signal. A conversion gain calibration unit outputs the conversion gain value based on the output frequency signal, which is output based on the voltage stored in the PLL circuit, the modulation signal having a value, and the reference frequency signal during a deactivation period of the loop control signal.

In example embodiments, the input unit may include a first adder that adds the channel frequency signal and the modulation data. A sigma-delta modulator modulates an output signal of the first adder and outputs the division control signal.

In example embodiments, the PLL circuit may include a divider that divides the output frequency signal based on the division control signal. A phase frequency detector detects differences in phase and frequency between the reference frequency signal and the divided output frequency signal. A charge pump pumps charge based on an output signal of the phase frequency detector and outputs a pumping voltage. A switch that is turned on during the activation period of the loop control signal transmits the pumping voltage. A loop filter changes the voltage based on the pumping voltage applied through the switch and stores the changed voltage. A second adder adds the voltage stored in the loop filter and the modulation signal. A voltage-controlled oscillator generates the output frequency signal based on an output signal of the second adder.

In example embodiments, the loop filter may be a low-pass filter including a capacitor.

In example embodiments, the modulation signal generator may be a digital-to-analog converter that adjusts a digital-to-analog conversion gain based on the conversion gain value and converts the modulation data into the modulation signal based on the adjusted digital-to-analog conversion gain.

In example embodiments, the conversion gain calibration unit may include a frequency-digital converter that outputs digital output data based on the reference frequency signal and the output frequency signal during the deactivation period of the loop control signal. A gain calibrator calculates and outputs the conversion gain value using the output data and the modulation signal having the predetermined value during the deactivation period of the loop control signal.

In example embodiments, the frequency-digital converter may include a counter that counts a number of oscillations of the output frequency signal applied in every period of the reference frequency signal and outputs a count value during the deactivation period of the loop control signal. A decimation filter calculates an average of the count values continuously applied and outputs the output data.

Other example embodiments are directed to a method for calibrating conversion gain of a two-point phase modulator. The method includes forming, at a PLL circuit, a loop during an activation period of a loop control signal at a beginning stage, storing a voltage corresponding to a difference in phase between a divided output frequency signal and a reference signal based on a channel frequency signal and generating an output frequency signal corresponding to the stored voltage, and opening the loop of the PLL circuit during a deactivation period of the loop control signal and calculating a calibrated conversion gain value using an output frequency signal changed corresponding to a sum of a modulation signal having a predetermined value and the stored voltage.

In example embodiments, forming the loop of the PLL circuit may include forming, at the PLL circuit, the loop based on the loop control signal, outputting a division control signal based on the channel frequency signal, dividing the output frequency signal based on the division control signal, comparing the phase and frequency of the divided output frequency signal with those of a reference frequency signal, outputting a pumping voltage by pumping charge based on the phase and frequency comparison result, generating and storing a voltage corresponding to the pumping voltage, and outputting an output frequency signal corresponding to the stored voltage.

In example embodiments, opening the loop of the PLL circuit may include opening the loop of the PLL circuit based on the loop control signal, receiving modulation data having the predetermined value, converting it into the modulation signal based on a conversion gain determined by a predetermined initial conversion gain value, and outputting the modulation signal, changing the output frequency signal based on the modulation signal and the voltage stored in the PLL circuit, and outputting the changed output frequency signal, converting the output frequency signal into output data based on the reference frequency signal, and calculating a calibrated conversion gain value based on the output data, the initial conversion gain value, and the modulation data having the predetermined value.

In example embodiments, changing and outputting the output frequency signal may include adding the stored voltage and the modulation signal, and generating and outputting the output frequency signal based on the added signal.

In example embodiments, converting the output frequency signal into output data may include counting a number of oscillations of the output frequency signal during one period of the reference frequency signal and outputting a count value, and calculating an average of continuously applied count values.

In example embodiments, the method may further include re-forming, at the PLL circuit, the loop during the activation period after the deactivation period of the loop control signal, and modulating the modulation data into the output frequency signal corresponding to the calibrated conversion gain value.

In example embodiments, re-forming the loop of the PLL circuit may include forming, at the PLL circuit, the loop based on the loop control signal, outputting a division control signal based on the channel frequency signal and the modulation data, converting the modulation data into the modulation signal based on the calibrated conversion gain value, and changing a phase of the output frequency signal based on the division control signal, the reference frequency signal, and the modulation signal.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
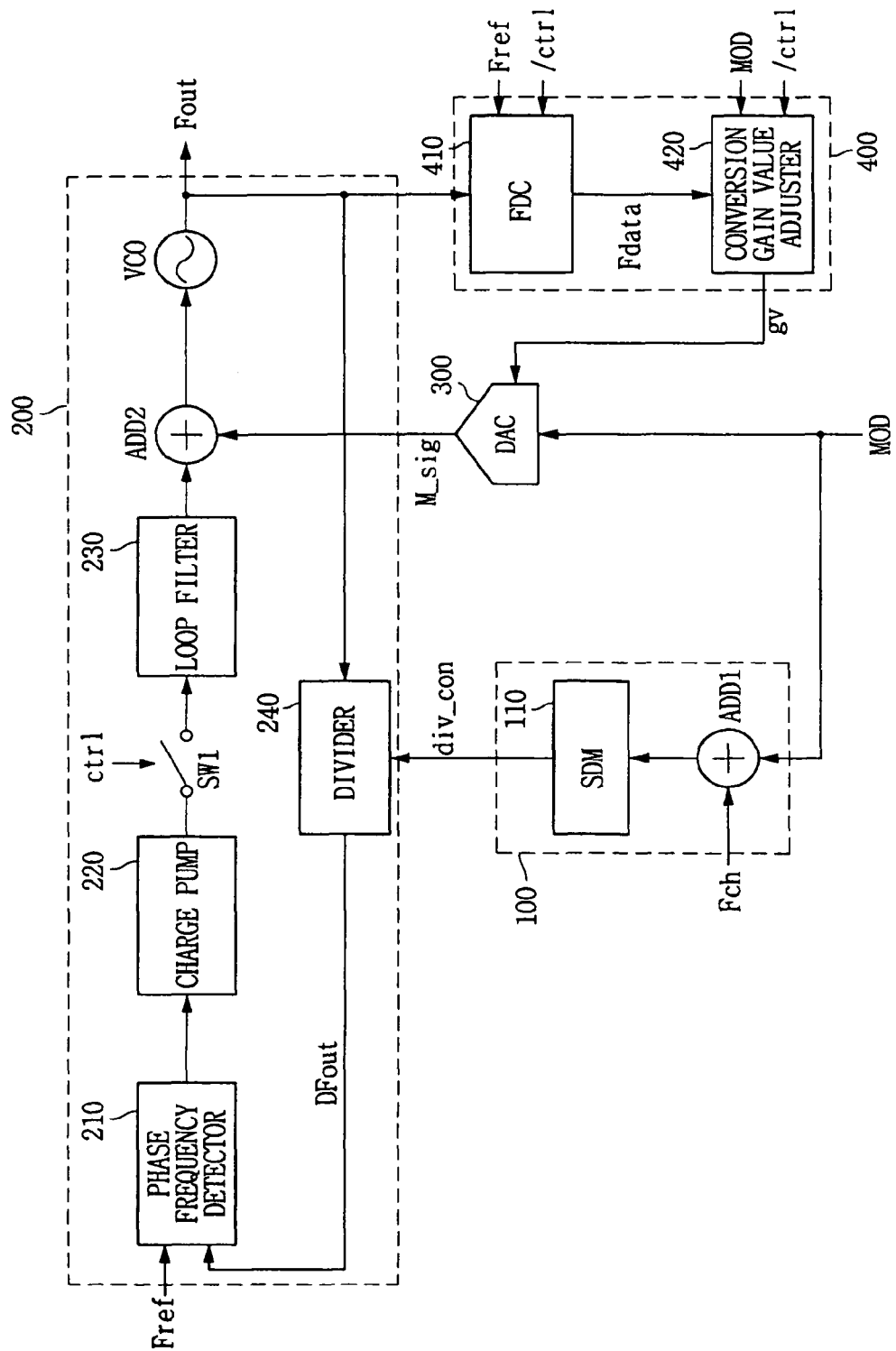
FIG. 1 illustrates a two-point phase modulator according to example embodiments.

Example embodiments will now be described more fully with reference to the accompanying drawings. Many alternate forms may be embodied and example embodiments should not be construed as limited to example embodiments set forth herein. In the drawings, the thicknesses of layers and regions may be exaggerated for clarity, and like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein to describe one element Fch or a relationship between a feature and another element or feature as illustrated in the figures. It will be understood that spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/operations noted may occur out of the order noted in the figures. For example, two figures shown in succession may in fact be executed substantially concurrently, or may sometimes be executed in reverse order, depending upon the functions/operations involved.

Example embodiments relate to a two-point phase modulator and a method of calibrating conversion gain of the same.

A two-point phase modulator has a feedback path for adjusting the division ratio of a divider of a phase-locked loop (PLL) and a feedforward path for applying modulation data to a voltage-controlled oscillator. In the feedforward path, the modulation data may not be directly applied to the voltage-controlled oscillator but goes through a conversion process such as digital-to-analog conversion. When a conversion gain of the conversion process coincides with a gain of the feedback path, an output frequency signal of the two-point phase modulator may ensure a wide bandwidth without distortion. In general, since the gain of the feedback path is determined by the characteristics of the two-point phase modulator, the gain (i.e., conversion gain) of the feedforward path coincides with the gain of the feedback path.

FIG. 1 is a block diagram illustrating a two-point phase modulator according to an example embodiment. The two-point phase modulator includes an input unit 100, a PLL circuit 200, a modulation signal generator 300, and a conversion gain calibration unit 400. The input unit 100 may output a division control signal div_con for controlling the frequency of an output frequency signal Fout based on a channel frequency signal Fch and modulation data MOD. The PLL circuit 200 may output the output frequency signal Fout following a reference frequency signal Fref and controlled based on the division control signal div_con and a modulation signal M_sig. The modulation signal generator 300 may convert the modulation data MOD into the modulation signal M_sig based on a conversion gain value gv for controlling digital-to-analog conversion gain of the modulation data MOD and output the modulation signal M_sig. The conversion gain calibration unit 400 may calibrate and output the conversion gain value gv based on the output frequency signal Fout and the reference frequency signal Fref.

The input unit 100 may include an adder ADD1 and a sigma-delta modulator (SDM) 110. The adder ADD1 may add the channel frequency signal Fch and the modulation data MOD and output the added signal. The SDM 110 may sigma-delta convert the added signal of the adder ADD1 and output the division control signal div_con.

The PLL circuit 200 may include a divider 240, a phase frequency detector 210, a charge pump 220, a switch SW1, a loop filter 230, an adder ADD2, and a voltage-controlled oscillator VCO. The divider 240 may divide the output frequency signal Fout based on the division control signal div_con applied from the input unit 100 and output a divided output frequency signal DFout. The phase frequency detector 210 may detect differences in phase and frequency between the reference frequency signal Fref and the divided output frequency signal DFout. The charge pump 220 may charge or pump charge based on an output signal of the phase frequency detector 210. The switch SW1 may open a loop of the PLL circuit 200 based on a loop control signal ctrl. The loop filter 230 may filter an output signal of the charge pump 220 applied through the switch SW1. The adder ADD2 may add an output signal of the loop filter 230 and the modulation signal M_sig applied from the modulation signal generator 300. The voltage-controlled oscillator VCO may generate and output the output frequency signal Fout based on an output signal of the adder ADD2. In general, the loop filter 230 may be implemented as a low-pass filter, and as is well known in the art the low-pass filter includes a capacitor. Thus, even if the PLL loop is opened as the switch SW1 is turned off, the loop filter 230 may maintain the output voltage corresponding to the signal previously applied from the charge pump 220. Since low-pass filters are well known in the art, a description thereof will be omitted.

The modulation signal generator 300 may be implemented as a digital-to-analog converter that adjusts a digital-to-analog conversion gain based on the conversion gain value gv applied from the conversion gain calibration unit 400, and converts the digital modulation data MOD into the analog modulation signal M_sig based on the adjusted digital-to-analog conversion gain.

The conversion gain calibration unit 400 may include a frequency-digital converter (FDC) 410 and a conversion gain value adjuster 420. The FDC 410 may be activated based on an inverted loop control signal /ctrl and output digital output data Fdata based on the reference frequency signal Fref and the output frequency signal Fout. The conversion gain value adjuster 420 may be activated based on the inverted loop control signal /ctrl and calibrate and output the conversion gain value gv based on the output data Fdata and the modulation data MOD.

Figure 2:
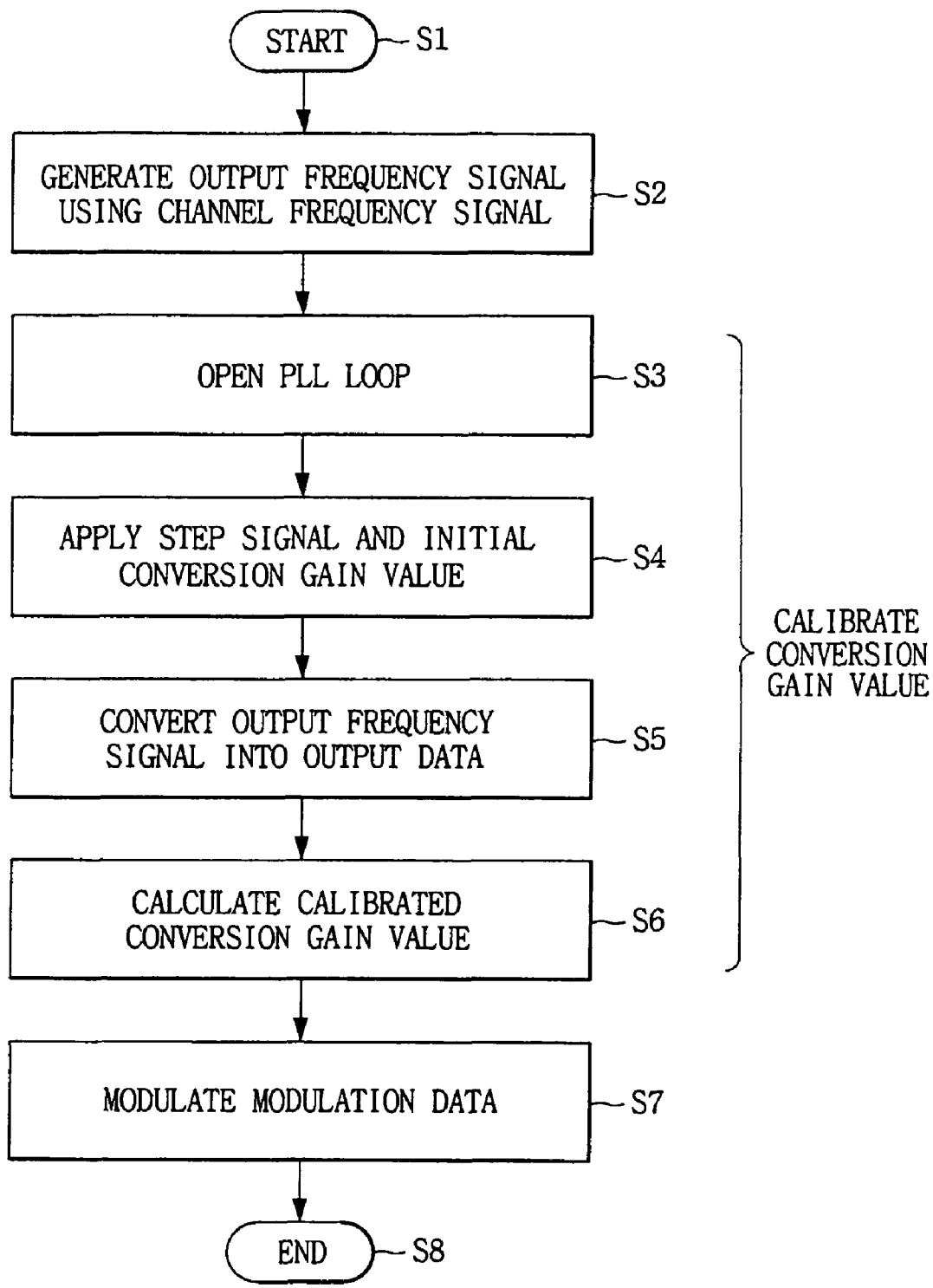
FIG. 2 illustrates a method of operating a two-point phase modulator according to example embodiments.

FIG. 2 illustrates a method of operating the two-point phase modulator of FIG. 1.

Referring to FIGS. 1 and 2, operation of the two-point phase modulator according to an example embodiment will now be described. At S1, operation of the two-point phase modulator is started. The loop control signal ctrl is activated at the beginning of operation and deactivated after a period of time (e.g., about 50 μs). Thus, the PLL circuit 200 may start operation with a loop formed.

When operation of the two-point phase modulator is started, the channel frequency signal Fch may be applied to the input unit 100. Since the channel frequency signal Fch is applied and the modulation data MOD is not applied, the adder ADD1 may output the channel frequency signal Fch to the SDM 110, and the SDM 110 may sigma-delta modulate the channel frequency signal Fch and output the division control signal div_con. Moreover, since the modulation data MOD is not applied, the modulation signal generator 300 does not output the modulation signal M_sig.

Since the loop of the PLL circuit 200 is formed and the modulation signal M_sig is not applied, the frequency of the output frequency signal Fout may be determined by the reference frequency signal Fref and the division control signal div_con. Also, since the division control signal div_con is generated only by the channel frequency signal Fch, the output frequency signal Fout may be generated only by the reference frequency signal Fref and the channel frequency signal Fch. Further, since the channel frequency signal Fch and the reference frequency signal Fref are not changed, the output frequency signal Fout may be locked and output at S2.

At S3, the loop control signal ctrl is deactivated after the output frequency signal Fout is locked. Thus, the period during which the initial loop control signal ctrl is activated may be adjusted considering the characteristics of the two-point phase modulator and the channel frequency signal Fch and the reference frequency signal Fref.

When the loop control signal ctrl is deactivated, the switch SW1 of the PLL circuit 200 is turned off, and thus the loop of the PLL circuit 200 may be opened. As explained above, even if the loop of the PLL circuit 200 is opened, the output voltage corresponding to a signal previously applied from the charge pump 220 is stored in the capacitor of the loop filter 230. Since the switch SW1 is turned off, the charge stored in the capacitor of the loop filter 230 is not lost, if no current flows through the adder ADD2. Thus, the output voltage may be maintained. Accordingly, even if the loop of the PLL circuit 200 is opened, the PLL circuit 200 may apply the same voltage as the previous state to the adder ADD2.

When the loop of the PLL circuit 200 is opened, a step signal Fstep may be applied to the two-point phase modulator as the modulation data MOD at S4. The step signal Fstep is a value applied to calibrate the conversion gain value gv. Meanwhile, the conversion gain value adjuster 420 may output an initial conversion gain value gv_init as the conversion gain value gv to the modulation signal generator 300. Since the loop of the PLL circuit 200 is opened, the step signal Fstep does not have an effect on the output voltage of the loop filter 230, even if it is applied to the input unit 100. Thus, the step signal Fstep may be converted into the modulation signal M_sig by the digital-to-analog converter, that is, the modulation signal generator 300 and then applied to the adder ADD2.

At S5, the adder ADD2 may add the output of the loop filter 230 and the modulation signal M_sig, and the voltage-controlled oscillator VCO may generate and output the output frequency signal Fout based on an output signal of the adder ADD2. Here, since the modulation signal M_sig is additionally applied, the frequency of the output frequency signal Fout is different from when the loop of the PLL circuit 200 is closed. That is, a change in frequency occurs due to the step signal Fstep.

The frequency-digital converter 410, activated based on the inverted loop control signal /ctrl, may compare the output frequency signal Fout with the reference frequency signal Fref and output the output data Fdata corresponding to a frequency value of the output frequency signal Fout.

At S6, the conversion gain value adjuster 420 may receive the output data Fdata and the step signal Fstep, calculate a conversion gain value gv_fin, and output the calculated conversion gain value gv_fin as the conversion gain value gv to the modulation signal generator 300. The conversion gain value gv_fin may be calculated as [step signal Fstep*initial gain value gv_init/output data Fdata]. Although FIG. 1 shows that the conversion gain value adjuster 420 receives the modulation data MOD to receive the step signal Fstep, the step signal Fstep may be stored in advance in the conversion gain value adjuster 420 instead of being input via the modulation data MOD input.

The periods, S2 to S6, during which the loop of the PLL circuit 200 is opened as the loop control signal ctrl is deactivated may correspond to a period for calibrating the conversion gain value gv_fin. While S1 may correspond to a period for learning the characteristics of the feedback path, S2 to S6 may correspond to a period for learning the characteristics of the feedforward path in addition to the learned characteristics of the feedback path.

Since the conversion gain value gv_fin is calculated, the conversion gain calibration unit 400 may be deactivated when the loop control signal ctrl is reactivated, and the PLL circuit 200 may form the loop again. After this, when the channel frequency signal Fch and the modulation data MOD are applied, the two-point phase modulator may modulate the modulation data MOD and output the calibrated output frequency signal Fout at S7.

Figure 3:
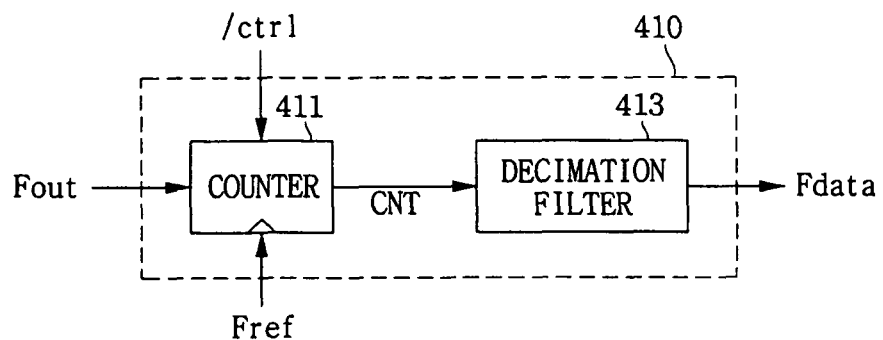
FIG. 3 illustrates an example embodiment of a frequency-digital converter of FIG. 1.

FIG. 3 is a block diagram illustrating an example embodiment of the frequency-digital converter of FIG. 1.

Referring to FIG. 3 the frequency-digital converter 410 includes a counter 411 and a decimation filter 413. The counter 411 may be activated based on the inverted loop control signal /ctrl, receive the reference frequency signal Fref and the output frequency signal Fout, count the number of oscillations of the output frequency signal Fout during one period of the reference frequency signal Fref, and output a count value CNT. The decimation filter 413 may calculate an average of the count values CNT applied for a period of time (e.g., 30 μs) and output the output data Fdata.

Figure 4:
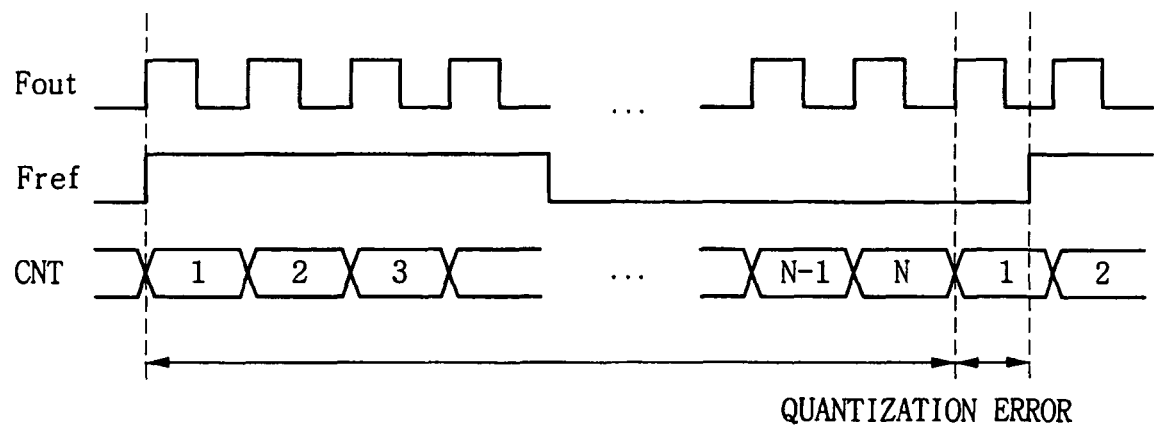
FIG. 4 is a timing diagram illustrating operation of the frequency-digital converter of FIG. 3 according to example embodiments.

FIG. 4 is a timing diagram illustrating operation of the frequency-digital converter of FIG. 3 according to an example embodiment.

Referring to FIGS. 3 and 4, operation of the frequency-digital converter 410 of FIG. 3 will now be described. The counter 411 may receive the reference frequency signal Fref as a clock signal and the output frequency signal Fout as an input signal. Thus, the counter 411 may count the number of oscillations of the output frequency signal Fout applied during one period of the reference frequency signal Fref. However, the period of the reference frequency signal Fref does not accurately coincide with an integer multiple of the period of the output frequency signal Fout. Accordingly, if the counter 411 outputs integers, the count value CNT may be output as a value of N or N+1 due to a quantization error, as shown in FIG. 4. To reduce the quantization error, the decimation filter 413 averages the count values CNT of N or N+1 applied for a period of time and outputs the output data Fdata having a decimal place. The output frequency signal Fout may be divided by a divider that is provided before the frequency-digital converter 410 and applied to the counter 411 to reduce the high frequency of the output frequency signal Fout. Moreover, when a counter capable of counting fractional values is used instead of a counter that outputs integers, the precision of the frequency-digital converter 410 may be further increased. Although the reference frequency signal Fref is used as the clock signal of the counter 411 in FIG. 3, other signals each having a period may be used.

According to a two-point phase modulator and a method of calibrating conversion gain of the same, the two-point phase modulator locks an output frequency signal by charging and pumping charge in a phase-locked loop (PLL) circuit at the beginning of operation, opens a loop of the PLL circuit for a period of time, and applies a step signal, thereby calibrating conversion gain of a modulation data that controls the output frequency signal. Thus, the conversion gain of the modulation data can be calibrated by the calibration operation at one time.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of the claims. Therefore, it is to be understood that the foregoing is illustrative of various example embodiments and not to be construed as limiting to the example embodiment disclosed, and that modifications to the disclosed embodiments, as well as other embodiments, are intended to be included within the scope of the appended claims.

What is claimed is:

1. A two-point phase modulator, comprising:
an input unit configured to output a division control signal based on a channel frequency signal and modulation data;
a phase-locked loop (PLL) circuit configured to form a loop during an activation period of a loop control signal, detect a difference in phase between a reference frequency signal and a divided output frequency signal, store a voltage corresponding to the difference in phase, output an output frequency signal, change a frequency of the output frequency signal based on the stored voltage and a modulation signal, and generate the divided output frequency signal by dividing the output frequency signal based on the division control signal;
a modulation signal generator configured to convert the modulation data from digital to analog based on a conversion gain value and output the modulation signal; and
a conversion gain calibration unit configured to output the conversion gain value based on the output frequency signal and the reference frequency signal during a deactivation period of the loop control signal, wherein the conversion gain calibration unit includes,
a frequency-digital converter configured to output digital output data based on the reference frequency signal and the output frequency signal during the deactivation period of the loop control signal, and
a gain calibrator configured to calculate and output the conversion gain value using the output data and the modulation signal during the deactivation period of the loop control signal.

2. The two-point phase modulator according to claim 1, wherein the input unit includes,
a first adder configured to add the channel frequency signal and the modulation data, and
a sigma-delta modulator configured to modulate an output signal of the first adder and output the division control signal.

3. The two-point phase modulator according to claim 1, wherein the PLL circuit includes,
a divider configured to divide the output frequency signal based on the division control signal, a phase frequency detector configured to detect differences in phase and frequency between the reference frequency signal and the divided output frequency signal, a charge pump configured to pump charge based on an output signal of the phase frequency detector and output a pumping voltage, a switch configured to be turned on during the activation period of the loop control signal to transmit the pumping voltage, a loop filter configured to change the voltage based on the pumping voltage applied through the switch and store the changed voltage as the voltage, a second adder configured to add the voltage stored in the loop filter and the modulation signal, and a voltage-controlled oscillator configured to output the output frequency signal based on an output signal of the second adder.

4. The two-point phase modulator according to claim 3, wherein the loop filter is a low-pass filter including a capacitor.

5. The two-point phase modulator according to claim 1, wherein the modulation signal generator is a digital-to-analog converter configured to adjust a digital-to-analog conversion gain based on the conversion gain value and convert the modulation data into the modulation signal based on the adjusted digital-to-analog conversion gain.

6. The two-point phase modulator according to claim 1, wherein the frequency-digital converter includes, a counter configured to count a number of oscillations of the output frequency signal applied in every period of the reference frequency signal and output a count value during the deactivation period of the loop control signal, and a decimation filter configured to calculate an average of the count values continuously applied and output the output data.

7. A method of calibrating conversion gain of a two-point phase modulator, the method comprising:

forming, at a phase-locked loop (PLL) circuit, a loop during an activation period of a loop control signal at a beginning stage, storing a voltage corresponding to a difference in phase between a divided output frequency signal and a reference frequency signal based on a channel frequency signal and generating an output frequency signal corresponding to the stored voltage; and opening the loop of the PLL circuit during a deactivation period of the loop control signal, and calculating a calibrated conversion gain value using the output frequency signal and a sum of a modulation signal and the stored voltage, wherein opening the loop of the PLL circuit includes, receiving and converting modulation data into the modulation signal based on a conversion gain determined by an initial conversion gain value, and outputting the modulation signal, changing the output frequency signal based on the modulation signal and the voltage stored in the PLL circuit and outputting the changed output frequency signal, converting the changed output frequency signal into output data based on the reference frequency signal, and calculating a calibrated conversion gain value based on the output data, the initial conversion gain value, and the modulation data.

8. The method according to claim 7, wherein forming the loop of the PLL circuit includes, outputting a division control signal based on the channel frequency signal, dividing the output frequency signal based on the division control signal, comparing the phase and a frequency of the divided output frequency signal with the phase and the frequency of the reference frequency signal, pumping charge based on the phase and frequency comparison result and outputting a pumping voltage, generating and storing a voltage corresponding to the pumping voltage, and outputting an output frequency signal corresponding to the stored voltage.

9. The method according to claim 7, wherein changing the output frequency signal includes, adding the stored voltage and the modulation signal, and generating and outputting the output changed frequency signal based on the added signal.

10. The method according to claim 9, wherein converting the output frequency signal into the output data includes, counting a number of oscillations of the output frequency signal during one period of the reference frequency signal and outputting a count value, and calculating an average of continuously applied count values.

11. The method according to claim 7, further comprising:

re-forming, at the PLL circuit, the loop during an activation period after the deactivation period of the loop control signal, and modulating modulation data into the output frequency signal based on the calibrated conversion gain value.

12. The method according to claim 11, wherein re-forming the loop of the PLL circuit includes, outputting a division control signal based on the channel frequency signal and the modulation data, converting the modulation data into the modulation signal based on the calibrated conversion gain value, and changing a phase of the output frequency signal based on the division control signal, the reference frequency signal, and the modulation signal.

13. A two-point phase modulator comprising:

a phase-locked loop (PLL) circuit configured to output an output frequency signal based on a reference frequency signal and a modulation signal, the PLL circuit including, a switch configured to open and close a loop of the PLL circuit based on a loop control signal, the switch being closed during an activation period and open during a deactivation period, a phase frequency detector configured to receive the reference frequency signal and a divided output frequency signal, a charge pump coupled to an output of the phase frequency detector a loop filter coupled to an output of the charge pump during an activation period, a second adder configured to receive an output of the loop filter and the modulation signal, an oscillator coupled to an output of the second adder and configured to output the output frequency signal, and a divider configured to receive the output frequency signal and the division control signal and output the divided output frequency signal;

a conversion gain calibration unit configured to operate based on an inverted loop control signal, the conversion gain calibration unit configured to compare the output frequency signal with the reference frequency signal and calibrate a conversion gain value based on the comparison during the deactivation period, the conversion gain value modulated with modulation data to generate a modulation signal to input to the PLL circuit, the conversion gain calibration unit including,
- a frequency digital converter configured to receive the output frequency signal and the reference frequency signal and output the output data based on the output frequency signal and the reference frequency signal during the deactivation period, and
- a conversion gain value adjuster configured to receive the output data and calibrate and output the conversion gain value based on the output data and the modulation data during the deactivation period; and an input unit configured to output a division control signal to the PLL circuit based on a channel frequency signal and the modulation data the input unit including a first adder to add the channel frequency signal and the modulation data.

14. The two-point phase modulator of claim 13, wherein the frequency digital converter includes,
- a counter configured to count a number of oscillations of the output frequency signal during a period of the reference frequency signal and output a count value during the deactivation period, and
- a decimation filter configured to calculate an average of the count values over a first period and output the output data.

15. The two-point phase modulator of claim 13, wherein the input unit further includes,
- a sigma delta modulator coupled to an output of the first adder and configured to output the division control signal.

16. A method of calibrating conversion gain of a two point phase modulator, the method comprising:

first generating, by a phase-locked loop (PLL) circuit, an output frequency signal based on a channel frequency signal;
opening, by a switch in the PLL circuit, a loop of the PLL circuit;
calibrating, by a conversion gain calibration unit, the conversion gain if the loop of the PLL circuit is opened; and
second generating, by the PLL circuit, a calibrated output frequency signal based on the calibrated conversion gain, wherein the calibrating the conversion gain includes,
- applying a step signal to the conversion gain calibration unit,
- converting, by a frequency digital converter, the output frequency signal into output data, the output data corresponding to a frequency value of the output frequency signal, and
- calculating a calibrated conversion gain value.

17. The method of claim 16, wherein the applying the step signal includes,
outputting, by the conversion gain calibration unit, an initial conversion gain value.

18. The method of claim 16, wherein the converting includes,
comparing the output frequency signal with a reference frequency signal.

19. The method of claim 16, wherein the first generating includes,
dividing the output frequency signal, and
storing a voltage corresponding to a difference in phase between the divided output frequency signal and a reference frequency signal, the output frequency signal corresponding to the stored voltage.

* * * * *